(12) United States Patent
Suda et al.

(10) Patent No.: US 6,553,516 B1
(45) Date of Patent: Apr. 22, 2003

(54) INTERLEAVING METHOD, INTERLEAVING APPARATUS, TURBO ENCODING METHOD, AND TURBO ENCODER

(75) Inventors: Hirohito Suda, Yokosuka (JP); Akira Shibutani, Tokyo (JP)

(73) Assignee: NTT Mobile Communications Network, Inc., Tokyo (JP)

( * ) Notice: Subject to any disclaimer, the term of this patent is extended or adjusted under 35 U.S.C. 154(b) by 0 days.

(21) Appl. No.: 09/506,684

(22) Filed: Feb. 18, 2000

(30) Foreign Application Priority Data

| Feb. 19, 1999 | (JP) | ............ 11-042137 |
| Apr. 5, 1999 | (JP) | ............ 11-098160 |

(51) Int. Cl.[7] .................. G11C 29/00; H03M 13/00
(52) U.S. Cl. ...................... 714/702; 714/786
(58) Field of Search ............... 714/701–702, 714/786; 341/81

(56) References Cited

U.S. PATENT DOCUMENTS

| 4,413,340 A | 11/1983 | Odaka et al. ............ 714/761 |
| 5,742,612 A | 4/1998 | Gourgue et al. ......... 714/701 |
| 6,347,385 B1 | 2/2002 | Cui et al. .............. 714/701 |

FOREIGN PATENT DOCUMENTS

| CA | WO-00/42709 A1 * | 7/2000 | ...... H03M/13/27 |
| EP | 0 105 499 | 4/1984 | |
| EP | 0 341 851 | 11/1989 | |
| WO | WO 00/08770 | 2/2000 | |

OTHER PUBLICATIONS

A.A. El–Azm, et al., Proceedings of the $2^{nd}$ IEEE Symposium on Computers and Communications, pps. 364–369, "Designing a Concatenated Coding System for Reliable Satellite and Space Communications," 1997.

S. Dolinar, et al., TDA Progress Report 42–122, pps. 56–65, "Weight Distributions for Turbo Codes Using Random and Nonrandom Permutations," Aug. 15, 1995.

S.V. Maric, Electronics Letters, vol. 30, No. 17, pps. 1378–1379, "Class of Algebraically Constructed Permutations for Use in Pseudorandom Interleavers," Aug. 18, 1994.

M. Eroz, et al., IEEE Vehicular Technology Conference, vol. 2, pp. 1669–1673, "On the Design of Prunable Interleavers for Turbo Codes", May 16, 1999.

* cited by examiner

*Primary Examiner*—Albert Decady
*Assistant Examiner*—Shelly A Chase
(74) *Attorney, Agent, or Firm*—Oblon, Spivak, McClelland, Maier & Neustadt, P.C.

(57) ABSTRACT

An interleaving method including the step of (1) receiving a data sequence having a plurality of blocks, each having a length based on a prime number P; (2) generating sequence permutation data by performing a given operation on elements of a Galois field of a characteristic P; (3) permuting results of the given operation, so that sequence permutation data are generated; and (4) permuting a sequence of data of the data sequence in accordance with the sequence permutation data.

51 Claims, 15 Drawing Sheets

(FROM THE SECOND ITERATION)
L: Log LIKELIHOOD RATIO)  Le1,2: EXTRINSIC INFORMATION

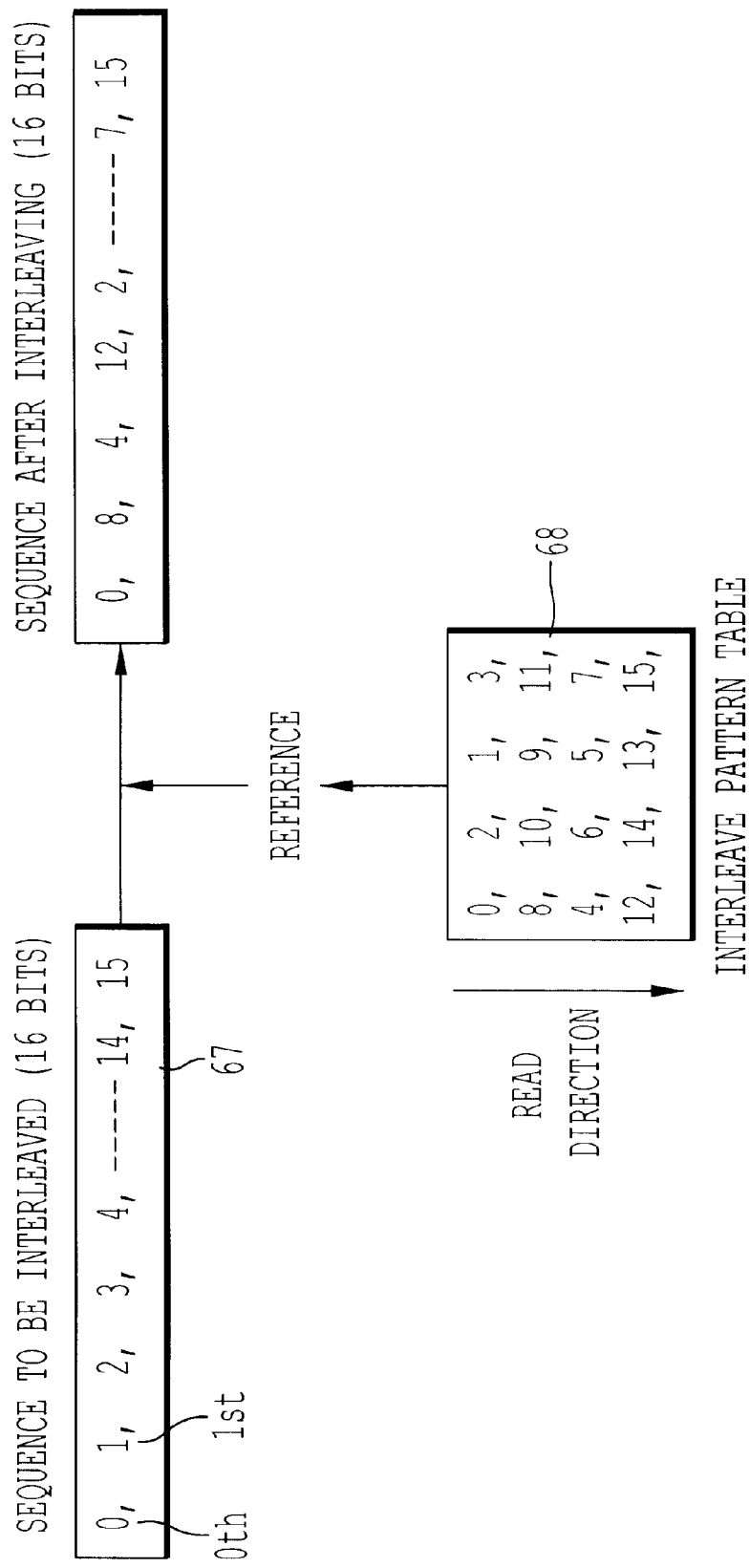

| (1) | 101 |
| 2 | 103 |
| 3 | 107 |
| 5 | 109 |
| 7 | |
| | 113 |
| 11 | 127 |
| 13 | 131 |
| 17 | 137 |
| 19 | 139 |
| 23 | |
| | 149 |
| 29 | 151 |
| 31 | 157 |
| 37 | 163 |
| 41 | 167 |
| 43 | |
| | 173 |
| 47 | 179 |
| 53 | 181 |
| 59 | 191 |
| 61 | 193 |
| 67 | |
| | 197 |
| 71 | 199 |
| 73 | |
| 79 | |
| 83 | |
| 89 | |
| 97 | |

*FIG. 4*

| p | q | p | q | p | q |
|---|---|---|---|---|---|
| 2 | 1 | 53 | 2 | 127 | 3 |
| 3 | 2 | 59 | 2 | 131 | 2 |
| 5 | 2 | 61 | 2 | 137 | 3 |
| 7 | 3 | 67 | 2 | 139 | 2 |
| 11 | 2 | 71 | 7 | 149 | 2 |
| 13 | 2 | 73 | 5 | | |
| 17 | 3 | 79 | 3 | | |
| 19 | 2 | 83 | 2 | | |
| 23 | 5 | 89 | 3 | | |
| 29 | 2 | 97 | 5 | | |
| 31 | 3 | 101 | 2 | | |
| 37 | 2 | 103 | 5 | | |
| 41 | 6 | 107 | 2 | | |
| 43 | 3 | 109 | 6 | | |
| 47 | 5 | 113 | 3 | | |

*FIG. 6*

| N | 0 | 1 | 2 | 3 | 4 | 5 | 6 | 7 | 8 | 9 |
|---|---|---|---|---|---|---|---|---|---|---|
| 0 | 82 | 0 | 1 | 72 | 2 | 27 | 73 | 8 | 3 | 62 |
| 1 | 28 | 24 | 74 | 77 | 9 | 17 | 4 | 56 | 63 | 47 |
| 2 | 29 | 80 | 25 | 60 | 75 | 54 | 78 | 52 | 10 | 12 |
| 3 | 18 | 38 | 5 | 14 | 57 | 35 | 64 | 20 | 48 | 67 |
| 4 | 30 | 40 | 81 | 71 | 26 | 7 | 61 | 23 | 76 | 16 |
| 5 | 55 | 46 | 79 | 59 | 53 | 51 | 11 | 37 | 13 | 34 |
| 6 | 19 | 66 | 39 | 70 | 6 | 22 | 15 | 45 | 58 | 50 |
| 7 | 36 | 33 | 65 | 69 | 21 | 44 | 49 | 32 | 68 | 43 |
| 8 | 31 | 42 | 41 | | | | | | | |

*FIG. 7A*

| I | 0 | 1 | 2 | 3 | 4 | 5 | 6 | 7 | 8 | 9 |
|---|---|---|---|---|---|---|---|---|---|---|
| 0 | 1 | 2 | 4 | 8 | 16 | 32 | 64 | 45 | 7 | 14 |
| 1 | 28 | 56 | 29 | 58 | 33 | 66 | 49 | 15 | 30 | 60 |
| 2 | 37 | 74 | 65 | 47 | 11 | 22 | 44 | 5 | 10 | 20 |
| 3 | 40 | 80 | 77 | 71 | 59 | 35 | 70 | 57 | 31 | 62 |
| 4 | 41 | 82 | 81 | 79 | 75 | 67 | 51 | 19 | 38 | 76 |
| 5 | 69 | 55 | 27 | 54 | 25 | 50 | 17 | 34 | 68 | 53 |
| 6 | 23 | 46 | 9 | 18 | 36 | 72 | 61 | 39 | 78 | 73 |
| 7 | 63 | 43 | 3 | 6 | 12 | 24 | 48 | 13 | 26 | 52 |
| 8 | 21 | 42 | 0 | | | | | | | |

*FIG. 7B*

| I | 0 | 1 | 2 | 3 | 4 | 5 | 6 | 7 | 8 | 9 |
|---|---|---|---|---|---|---|---|---|---|---|
| 0 | 1 | 2 | 4 | 8 | 16 | 32 | 64 | 45 | 7 | 14 |
| 1 | 28 | 56 | 29 | 58 | 33 | 66 | 49 | 15 | 30 | 60 |
| 2 | 37 | 74 | 65 | 47 | 11 | 22 | 44 | 5 | 10 | 20 |
| 3 | 40 | 80 | 77 | 71 | 59 | 35 | 70 | 57 | 31 | 62 |
| 4 | 41 | 82 | 81 | 79 | 75 | 67 | 51 | 19 | 38 | 76 |
| 5 | 69 | 55 | 27 | 54 | 25 | 50 | 17 | 34 | 68 | 53 |
| 6 | 23 | 46 | 9 | 18 | 36 | 72 | 61 | 39 | 78 | 73 |
| 7 | 63 | 43 | 3 | 6 | 12 | 24 | 48 | 13 | 26 | 52 |
| 8 | 21 | 42 | 0 | | | | | | | |

*FIG. 14A*

| I | 0 | 1 | 2 | 3 | 4 | 5 | 6 | 7 | 8 | 9 |
|---|---|---|---|---|---|---|---|---|---|---|
| 0 | 0 | 1 | 3 | 7 | 15 | 31 | 63 | 44 | 6 | 13 |
| 1 | 27 | 55 | 28 | 57 | 32 | 65 | 48 | 14 | 29 | 59 |
| 2 | 36 | 73 | 64 | 46 | 10 | 21 | 43 | 4 | 9 | 19 |
| 3 | 39 | 79 | 76 | 70 | 58 | 34 | 69 | 56 | 30 | 61 |
| 4 | 40 | 81 | 80 | 78 | 74 | 66 | 50 | 18 | 37 | 75 |
| 5 | 68 | 54 | 26 | 53 | 24 | 49 | 16 | 33 | 67 | 52 |
| 6 | 22 | 45 | 8 | 17 | 35 | 71 | 60 | 38 | 77 | 72 |
| 7 | 62 | 42 | 2 | 5 | 11 | 23 | 47 | 12 | 25 | 51 |
| 8 | 20 | 41 | | | | | | | | |

*FIG. 14B*

| I | 0 | 1 | 2 | 3 | 4 | 5 | 6 | 7 | 8 | 9 |
|---|---|---|---|---|---|---|---|---|---|---|
| 0 | 1 | 2 | 4 | 8 | 16 | 32 | 64 | 45 | 7 | 14 |
| 1 | 28 | 56 | 29 | 58 | 33 | 66 | 49 | 15 | 30 | 60 |
| 2 | 37 | 74 | 65 | 47 | 11 | 22 | 44 | 5 | 10 | 20 |
| 3 | 40 | 80 | 77 | 71 | 59 | 35 | 70 | 57 | 31 | 62 |
| 4 | 41 | 82 | 81 | 79 | 75 | 67 | 51 | 19 | 38 | 76 |
| 5 | 69 | 55 | 27 | 54 | 25 | 50 | 17 | 34 | 68 | 53 |
| 6 | 23 | 46 | 9 | 18 | 36 | 72 | 61 | 39 | 78 | 73 |
| 7 | 63 | 43 | 3 | 6 | 12 | 24 | 48 | 13 | 26 | 52 |
| 8 | 21 | 42 | 0 | 83 | | | | | | |

*FIG. 14C*

INTERLEAVING METHOD, INTERLEAVING APPARATUS, TURBO ENCODING METHOD, AND TURBO ENCODER

BACKGROUND OF THE INVENTION

1. Field of the Invention

The present invention generally relates to the turbo encoding technique that effectively copes with a burst error. More particularly, the present invention is concerned with an interleaving method, an interleaving apparatus, a turbo encoding method, and a turbo encoder in which pruning is not performed at all or only a small number of bits is pruned away, so that computational complexity can be reduced.

The present invention can be applied to fields required to improve reliability of communications using error correction codes, such as digital transmissions and digital recording. The present invention is particularly effective in fields which require flexibility of communications such as multimedia.

2. Description of the Related Art

Recently, a turbo encoder has been proposed which utilizes a code having high capability in error correction. Such a turbo encoder is made up of a plurality of encoders, which are coupled together via an interleaver (which is means for performing interleaving processing) in order to reduce the correlation between redundant sequences associated with the respective encoders. The interleaver is a key element which determines the performance of turbo encoding.

FIGS. 1A and 1B show an example of the turbo encoder. As shown in FIG. 1A, the turbo encoder includes recursive systematic convolutional encoders 12 (RSC1) and 13 (RSC2), and an interleaver 11. As shown in FIG. 1B, each of the encoders 12 and 13 is made up of adders 14 and 15 and delay elements (D) 16 and 17 connected as shown therein. The turbo encoder receives an input data sequence d (K bits) and outputs encoded data sequences X1–X3. In order to reduce the correlation between the redundant bits X1 and X2, the interleaver 11 is provided at the input side of the encoder (RSC2) 13. As shown in FIG. 1C, a turbo decoder is made up to two decoders 1 and 2, two interleavers 3 and 4, and a deinterleaver 5.

In digital systems, permutation in interleaving is performed on a given unit basis of bit or symbol. The permutation is implemented by using a buffer or a pattern for permutation. When the buffer is used, data is written therein and is then read therefrom in a different sequence. When the pattern for permutation is used, data is permuted by referring to the pattern, which describes information concerning a permutation based on interleaving. The pattern described will be referred to as an interleave pattern.

A description will now be given of bit-based permutation processing using the interleave pattern.

FIG. 2 shows interleaving of a 16-bit sequence. In FIG. 2, a 16-bit sequence 67 is interleaved on the bit unit basis by referring to an interleave pattern table 68, which defines a sequence of interleaving. More particularly, the zeroth to 15th bits of the sequence 67 is written into a two-dimensional buffer by the interleave pattern table 68, and is then read therefrom in the order of 0, 8, 4, 12, . . . , as indicated by an arrow in FIG. 2. Thus, a bit sequence after interleaving is obtained as shown in FIG. 2.

The interleaver involved in interleaving is required to have the following three capabilities of:

(1) handling a variety of frame lengths (for example, thousands to ten thousands);

(2) producing the interleaved sequence with a small number of parameters; and (3) reducing computational complexity in creating the interleave pattern.

As to the first capability, if the parameters are merely prepared for all of the different frame lengths, a huge number of parameters will be prepared, and a huge memory capacity will be required to store the parameters. Thus, the above is impractical. There is another disadvantage that it takes a long time to compute respective optimal parameters for each of the different frame lengths.

The above problems may be solved by designing interleavers with a small number of parameters. This is related to the second capability. Interleavers equal in number to a power of 2 are prepared and pruning of data is performed. However, pruning of data requires an increased number of parameters for optimization, and the interleavers may not have good performance with respect to all of the frame lengths. That is, the interleavers have good performance for some frame lengths but do not operate well for other frame lengths.

Reduction in the amount of data to be pruned away is also related to the third capability. In this regard, the present inventors have proposed an improvement in pruning and performance (International Application No. PCT/JP98/05027). However, even the proposed improvement has high computational complexity in producing the interleave patterns.

SUMMARY OF THE INVENTION

It is a general object of the present invention to provide an improved interleaving technique having the above-mentioned three capabilities.

A more specific object of the present invention is to provide an interleaving method, an interleaving apparatus, a turbo encoding method and a turbo encoder capable of efficiently achieving randomization of input sequences of a variety of frame lengths with reduced computational complexity.

The above objects of the present invention are achieved by 1. An interleaving method comprising the steps of: receiving a data sequence having a plurality of blocks each having a length based on a prime number P; generating sequence permutation data by performing a given operation on elements of a Galois field of a characteristic P and permuting results of the given operation, so that sequence permutation data are generated; and permuting a sequence of data of the data sequence in accordance with the sequence permutation data.

The above objects of the present invention are also achieved by an interleaving method comprising the steps of: (a) generating or recording a prime number P; (b) dividing an input sequence into N blocks $B_1, B_2, \ldots, B_N$ each having a length equal to P where N is an integer equal to or greater than 2; (c) generating or recording first sequence permutation data in which elements of a Galois field of a characteristic P are arranged in an order of values of exponent parts of a power notation of the elements; (d) generating or recording (N−1) integers $p_1, p_2, \ldots, p_{N-1}$ which are mutually prime with respect to (P−1); (e) generating or recording second through Nth sequence permutation data by repeating, ith times (i=1−(N−1)), a process for generating ith sequence permutation data by cyclically reading data in the first sequence permutation data at intervals of $p_1$; (f) permuting data in the blocks $B_1$–$B_N$ in accordance with the first through Nth sequence permutation data; and (g) reading permuted data from the blocks $B_1$–$B_N$ in a given order.

The above-mentioned objects of the present invention are also achieved by an interleaving method comprising the steps of: (a) generating or recording a prime number P; (b) dividing an input sequence into N blocks $B_1, B_2, \ldots, B_N$ each having a length equal to P where N is an integer equal to or greater than 2; (c) generating or recording zeroth sequence permutation data in which elements of a Galois field of a characteristic P are arranged in an order of values of exponent parts of a power notation of the elements; (d) generating or recording N integers $p_1, p_2, \ldots, p_N$ which are mutually prime with respect to a primitive root used in the power notation; (e) generating or recording first through Nth sequence permutation data by repeating, ith times (i=1–N), a process for generating ith sequence permutation data which is a sequence of values of exponent parts in power notation of elements obtained by adding $q_i$ to data of the zeroth sequence permutation data; (f) permuting data in the blocks $B_1$–$B_N$ in accordance with the first through Nth sequence permutation data; and (g) reading permuted data from the blocks $B_1$–$B_N$ in a given order.

In the above step (b), each of the blocks may have a length equal to (P–1) or (P+1).

The above-mentioned objects of the present invention are also achieved by an interleaving apparatus which implements the above method.

The above-mentioned objects of the present invention are also achieved by a turbo encoding method comprising, as an interleaving method employed in a turbo encoder, the interleaving method as described above.

The above-mentioned objects of the present invention are also achieved by a turbo encoder comprising: a plurality of encoders; and the interleaving apparatus as described above.

BRIEF DESCRIPTION OF THE DRAWINGS

Other objects, features and advantages of the present invention will more apparent from the following detailed description when read in conjunction with the accompanying drawings in which:

FIG. 2 is a diagram of a conventional interleaving method of interleaving a 16-bit input data sequence;

FIG. 4 shows prime numbers up to 200;

FIG. 6 shows prime numbers less than 150 and associated primitive roots.

FIGS. 7A and 7B respectively show examples of sequence permutation tables;

FIGS. 14A, 14B and 14C respectively show examples of sequence permutation tables used in the fourth embodiment of the present invention.

DESCRIPTION OF THE PREFERRED EMBODIMENTS

A description will be given, with reference to the accompanying drawings, of embodiments of the present invention.

First Embodiment

Figure 3:
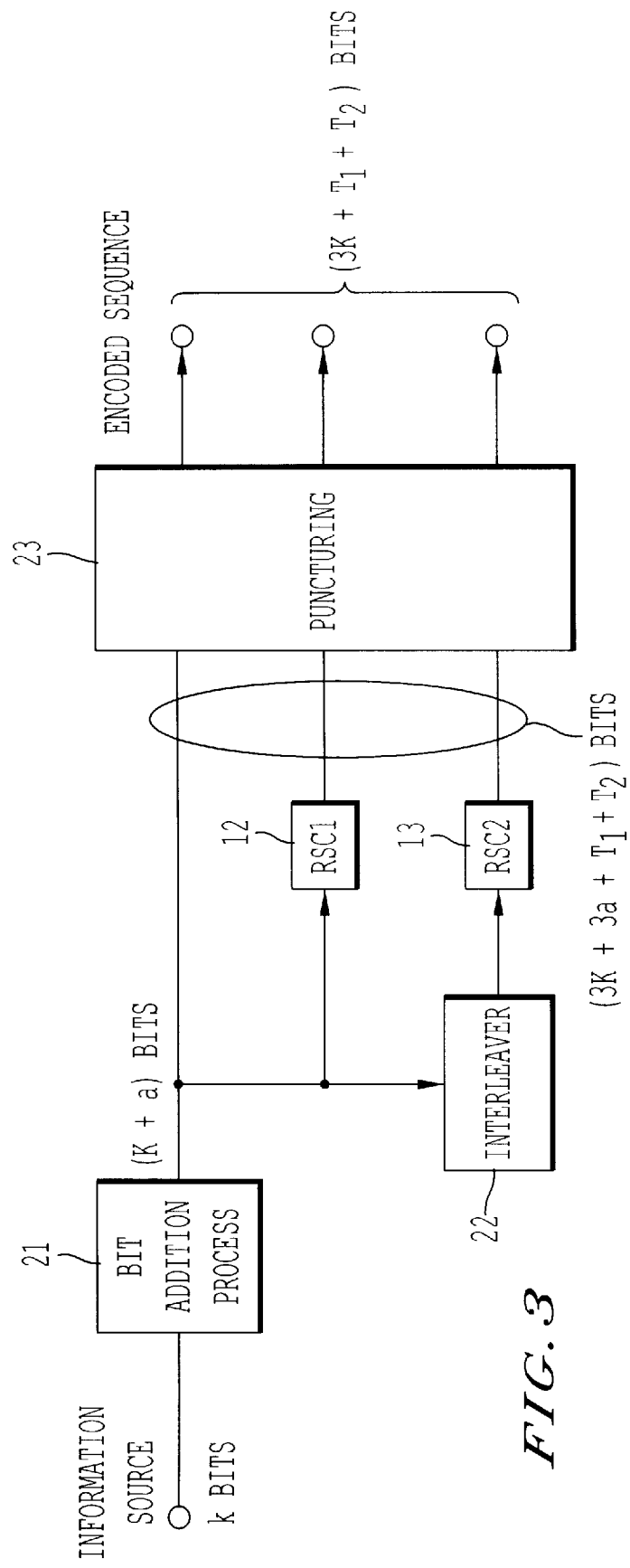
FIG. 3 is a block diagram of a turbo encoder according to a first embodiment of the present invention.

FIG. 3 is a block diagram of a turbo encoder according to the first embodiment of the present invention. In FIG. 3, parts that are the same as those shown in the previously described figures are given the same reference numbers.

The turbo encoder shown in FIG. 3 differs from that shown in FIG. 1A in the following:

(a) a bit addition process part 21 is newly added;

(b) an interleaver of a new configuration is used; and (c) a puncture processing part 23 is newly added.

A detailed description will be given of the turbo encoder shown in FIG. 3 by further referring to a flowchart of FIG. 10.

Bit Addition Process

Figure 10:
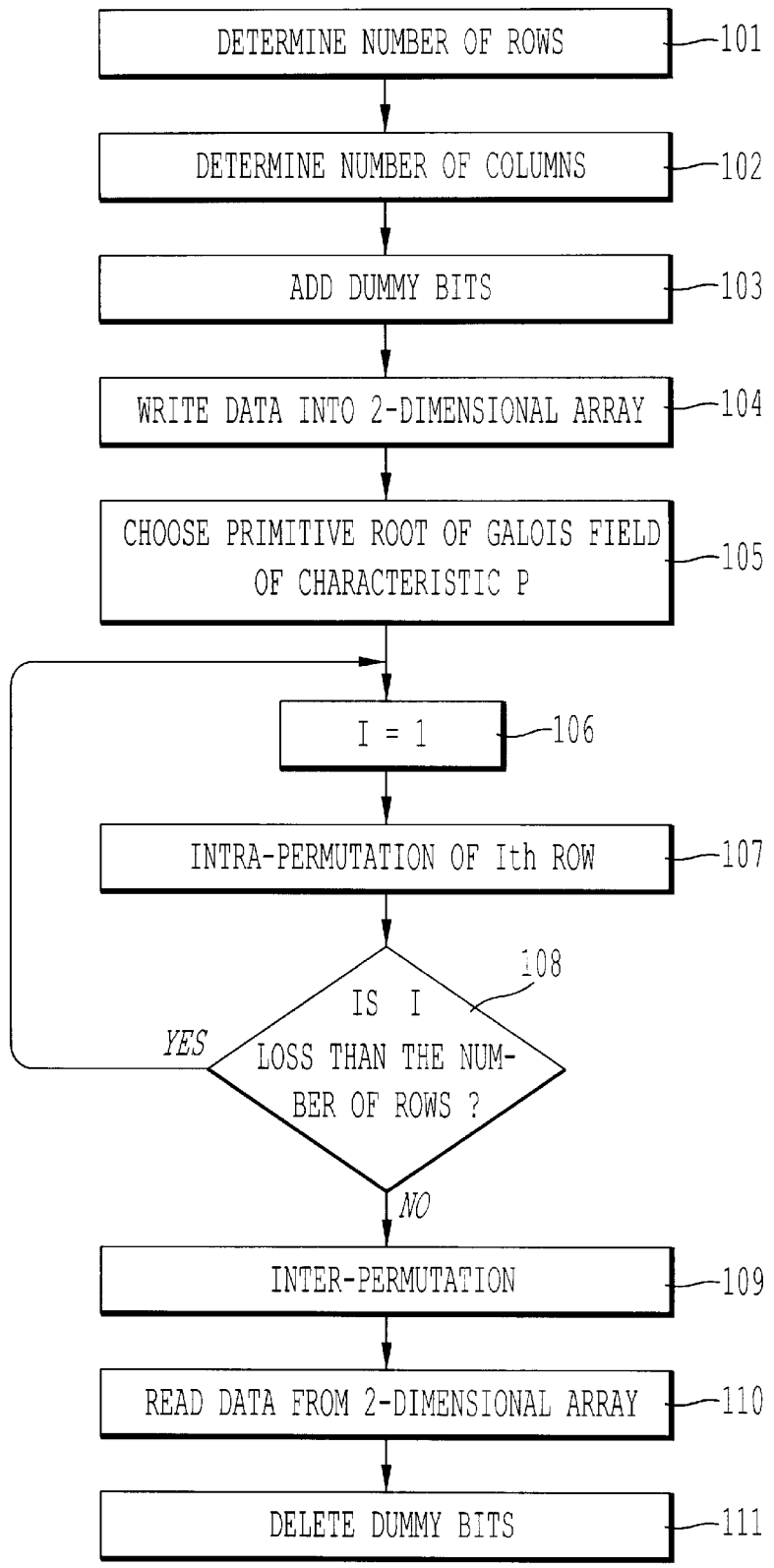
FIG. 10 is a flowchart of the turbo encoder according to the present invention.

As preprocessing of interleaving, the bit addition process part 21 adjusts the input sequence so that it has a suitable number of bits for interleaving (steps 101–103 shown in FIG. 10).

The bit addition process can be implemented by various types of conventional error correction coding. In this case, the bit addition process part 21 is a CRC encoder. Of the various types of conventional error correction coding, it is preferable to use a type of bit repetition in which bits are periodically repeated because it is flexible and is easily implemented.

A detailed description will be given of the bit repetition in a case where the number of bits input to the turbo encoder is $N_{IN}$ (which corresponds to K in FIG. 3). The bit repetition includes the following four steps (1)–(4).

At step (1), $N_{IN}$ is divided by 8, and the resultant value n is obtained. The reason why $N_{IN}$ is divided by 8 will be described later. At step (2), the prime number P that is greater than n and closest to n is obtained. At step (3), the difference between 8 times of P and $N_{IN}$ is calculated, and the resultant value is denoted as a. At step (4), a bits (dummy bits) are added to $N_{IN}$ bits of the input sequence.

An example for $N_{IN}$=650 will be described below. At step (1), n=650/8=81.25. At step (2), the prime number that is greater than 81.25 (=n) and closest thereto is 83 from a table shown in FIG. 4. That is, P=83. At step (3), 83*8=664, and thus a=14. That is, the number of dummy bits to be added to $N_{IN}$ is 14. At step (4), 14 dummy bits are added to the input sequence of 650 (=$N_{IN}$) bits. For example, the 14 dummy bits are added to the end of the 650-bit input sequence.

The number ($N_{IN}$+a) of bits thus obtained, that is, the number (K+a) of bits in FIG. 3 is divided by 8 without exception, and the quotient is always the prime number. The reason why 8 is used is that the number of rows of a two-dimensional array handled at a first stage of interleaving performed in the interleaver 22 is equal to 8, as will be described in detail later. It is possible to employ an arbitrary number such as 10 or 20 when the two-dimensional array used in the interleaver 22 has 10 or 20 rows. In such a case, 10 or 20 is used at the aforementioned steps (1)–(3).

It can be seen from the above description that the process performed by the bit addition process part 21 obtains the number of rows of the two-dimensional array at step 101 shown in FIG. 10, and determines the number of columns thereof which is the prime number, and adds, to the input sequence, the number of dummy bits equal to the difference between the product of the numbers of rows and columns and the number of bits of the input sequence.

Besides the bit repetition, it is possible to use block codes or convolutional codes in order to implement the bit addition process. It is also possible to employ a simple method of adding known bits to a known position.

Interleaver 22

The interleaver 22 has, for example, one of three different configurations described below.

(First configuration)

Figure 5:
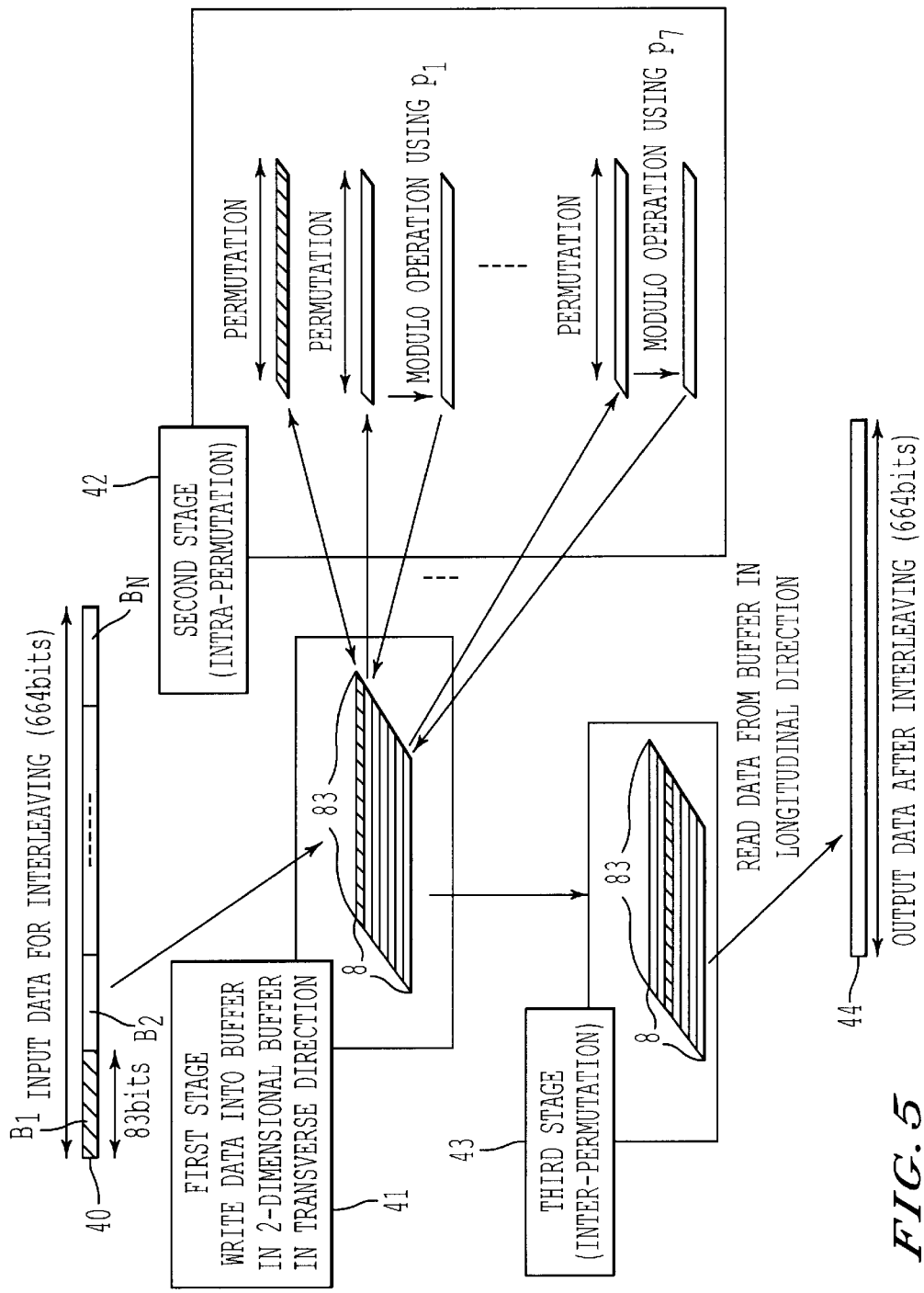
FIG. 5 is a diagram illustrating a first possible configuration of an interleaver shown in FIG. 3.

FIG. 5 shows the first configuration of the interleaver 22. The interleaver 22 having the first configuration includes the first, second and third stages 41, 42 and 43. The first stage 41 corresponds to step 104 shown in FIG. 10. The second stage 42 corresponds to steps 105–108 shown in FIG. 10. The third stage 43 corresponds to step 109 shown in FIG. 10.

(1) First stage 41:

An input sequence 40 (that is the output of the bit addition process part 21 and consists of, for example 664 bits) is divided into N. In FIG. 5, the 664-bit input sequence 40 is divided into eight blocks $B_1$–$B_8$, which are then written into a two-dimensional array (buffer), which consists of 8 rows and 83 columns. It will be noted that the 664-bit input sequence 40 includes 650 information bits and 14 dummy bits. The input sequence 40 of 664 bits can be divided by 8 and the quotient thereof is the prime number 83. Thus, the number of rows of the two-dimensional buffer is 8, and the number of columns thereof is the prime number 83.

(2) Second stage 42:

An intra-permutation is performed, as will be described later. In the intra-permutation, the sequence of the bits arranged in each row is permuted.

(3) Third stage 43:

An inter-permutation is performed in which the order of the rows arranged in the two-dimensional buffer is permuted. The inter-permutation uses, for example, a inter permutation pattern obtained by learning (directed to lengthening the free distance). One row is the unit of the inter-permutation.

After the first through third stages are performed, data is read from the two-dimensional buffer in the longitudinal direction (column direction) at step 110 shown in FIG. 10, whereby an interleaved coded sequence 44 can be obtained.

A further description will now be given of the second stage 42.

The intra-permutation at the second stage 42 uses a table created by the following steps S1–S7 as an address table, and processes input data written into the two-dimensional buffer by referring to the address table.

Step S1:

Step S1 is to obtain the primitive root $g_0$ of the Galois field of the characteristic P (which corresponds to the number of columns and is equal to 83 in the case shown in FIG. 5) at step 105 shown in FIG. 10, and to create a table t0 described in the order of exponential (power) notation of the primitive root in which the elements of the Galois field are expressed by anti-logarithms, which are arranged in the order of exponential notation. The primitive root $g_0$ of the Galois field of the characteristic P can be chosen from the table shown in FIG. 6. In other words, step S1 is to compute a mapping sequence c(i) for intra-row permutation defined below:

$$c(i) = (g_0^i)(\bmod P)$$

where i=0, 1, 2, ..., (P−2), and c(P−1)=0.

In the case of P=83, the primitive root $g_0$ (which corresponds to q in FIG. 6) of 83 is 2, and the elements of the associated Galois field are 0, 1, 2, ..., 82. Thus, c(0), c(1), c(2), ..., c(82) are as follows:

$$c(0), c(1), c(2), \ldots, c(82) = 2^0(\bmod 83), 2^1(\bmod 83), 2^2(\bmod 83), \ldots,$$

$$2^{82}(\bmod 83) = 1, 2, 4, 8, 16, 32, 64, 45, 7, 14, \ldots, 42, 0$$

The table t0 can be formed from the above one-dimensional sequence, as shown in FIG. 7B, in which the combination of the numerals arranged in the transverse-axis and longitudinal-axis directions of the table t0 describes the exponent. For example, the combination of numerals of 1 and 6 respectively in the transverse- and longitudinal-axis directions indicates an exponent of 16. It can be seen from the table t0 that the results of, for example, $2^2(\bmod 83)$ and $2^{16}(\bmod 83)$ are respectively 4 and 49. The result of $2^{82}(\bmod 83)$ is set equal to 0.

Step S2:

The table t0 is defined as a sequence permutation table for the first row of the two-dimensional buffer. Step S2 corresponds to a case when a parameter I indicative of the row number is set equal to 1 at step 106 shown in FIG. 10. That is, the numbers defined in the sequence permutation table t0 indicate the bit allocations after permutation. As shown in FIG. 7B, the sequence permutation table t0 includes the one-dimensional sequence (pattern) starting from the left uppermost position thereof:

Table t0: 1, 2, 4, 8, I6, ..., 41, 0     (1)

For example, let us assume that the input data mapped into the first row of the two-dimensional buffer is as follows:

A0, A1, A2, A3, ..., A82     (2)

The bits in the first row of the two-dimensional buffer are permuted by referring to the sequence permutation table t0. For example, bits A0 and A1 which correspond to "1" and "2" in the sequence permutation table t0 are placed in the original positions even after permutation. Bit A2 which corresponds to "4" in the table t0 is permuted so as to be located in the fourth position after permutation. Similarly, bit A3 which corresponds to "8" in the table t0 is permuted so as to be located in the eighth position after permutation. Bit A82 which corresponds to the last number "0" in the table t0 is placed in the original position. The above permutation is performed at step 107 shown in FIG. 10.

The data obtained after permutation of sequence (2) has the following sequence:

A0, A1, A72, A2, A27, A76, A8, ..., A82     (3)

Step S3:

Step S3 is to obtain (N−1) numbers (integers) which have the mutually prime relationship with respect to (P−1) where N is an integer greater than 2 and denotes the number of rows. In the example being considered, P=83 and N=8. Thus, 7 (=8−1) integers which are numbers p1, p2, p3, p4, p5, p6 and p7 that have the mutually prime relationship with respect to 82 (=P−1=83−1) are obtained. The 7 integers p1, p2, p3, p4, p5, p6 and p7 are respectively 3, 5, 7, 11, 13, 17 and 19 (1 and 2 are excluded).

Step S4:

At step 108 of FIG. 10, it is determined whether I is smaller than N (the number of rows). If the answer of step 108 is YES, the process returns to step 107. In the example being considered, I is incremented by 1 and is then equal to 2. Then, a sequence permutation table for permutation of data in the second row is created as follows. Data is cyclically read from the sequence permutation table t0 one by one at intervals of p1, and a sequence thus obtained is denoted as t1. For example, when data is circularly read from the sequence permutation table t0 at intervals of 3, the sequence t1 is obtained:

$$t1: 1, 16, 7, 29, 49, \quad (4)$$

The sequence t1 thus obtained is formed into sequence permutation table t1.

The above process is also performed by computing the following (mathematically equivalent thereto):

$$c(i) = (g_1^i)(\mod 83)$$

where g1 is the primitive root obtained from $g1 = (g_0^i)(\mod 83)$.

Step S5:

The table t1 obtained at step S4 is defined as a sequence permutation table which is referred to when the order of data arranged in the second row of the two-dimensional buffer is permuted.

Step S6:

Steps 4 and 5 are repeated by using p2, p3, p4, p5, p6 and p7, so that sequences t2–t7 can be obtained. The sequences t2–t7 are formed into tables t2–t7, which are defined as sequence permutation tables referred to at the time of permutation of the third to eighth rows of the two-dimensional buffer. That is, steps 106–108 shown in FIG. 10 can be described as follows.

First, prime numbers $l_i$ which satisfy the following are obtained where i=2–r, and r is the number of rows of the two-dimensional array:

$$(83-1, l_i) = 1 \text{ (82 and } l_i \text{ are mutually prime); and} \quad (i)$$

$$l_i > 6. \quad (ii)$$

For r=8, the prime numbers $l_2$–$l_6$ are those to be obtained, and are respectively 7, 11, 13, 17, 19, 23 and 19 from the table shown in FIG. 6. Then, the pieces of data in the table t0 are cyclically read one by one at intervals of $l_i$, so that the sequence permutation tables t2–t7 can be created. In this case, the number "0" located at the end of the table t0 is excluded in the read operation.

Step 7:

The data arranged in the first through eighth rows of the two-dimensional buffer in which the blocks $B_1$–$B_8$ are written are permuted in accordance with the sequence permutation tables t0–t7. More particularly, the sequence of the data of the block $B_1$ is permuted in accordance with the sequence permutation table t0. Similarly, the sequence of the data of the block $B_2$ is permuted in accordance with the sequence permutation table t1. The same process is carried out for each of the blocks $B_2$–$B_7$. Finally, the sequence of the data of the block $B_8$ is permuted in accordance with the sequence permutation table t8.

As described above, the sequence permutation tables t0–t7 are created, and then the permutation process for the blocks $B_1$–$B_8$ is performed. Alternatively, as shown in FIG. 10, the creation of the sequence permutation table and the permutation process are successively carried out for every block.

The process of the second stage can be designed so that the sequence permutation tables are prepared and recorded beforehand and the permutation process refers to the tables recorded beforehand.

(Second configuration of the interleaver 22)

A description will now be given of the second configuration of the interleaver 22, which is the same as that above except for the second stage. The permutation process of the second stage is implemented by referring to tables created by steps S11–S15 described below.

Step S11;

Step S11 is the same as the aforementioned step S1. That is, step S11 is to obtain the primitive root $g_0$ of the Galois field of the characteristic P and to create a table T0 described in the order of exponential notation of the primitive root in which the elements of the Galois field are expressed by anti-logarithms, which are arranged in the order of exponential notation. It will be noted that table T0 is the same as table t0 shown in FIG. 7B.

Step S12:

Step S12 is to obtain eight integers which have the mutually prime relationship with respect to the primitive root $g_0$ and are equal in number to the rows of the two-dimensional buffer. Let the eight numbers be denoted as q1, q2, q3, q4, q5, q6, q7 and q8. When the prime number P is equal to 83, for example, the primitive root is equal to 2 and the eight integers which are prime numbers are obtained as follows: 3, 5, 7, 11, 13, 17, 19 and 21 (except for 1 and 2).

Step 13:

The prime number q1 is added (mod P) to each of the items of data of the table T0 obtained at step S12. When the table T0 defines the following sequence:

$$T0: 1, 2, 4, 8, 16, \ldots 42, 0, \quad (5)$$

the resultant sequence for q1=3 is as follows:

$$4, 5, 7, 11, 19, \ldots, 3 \quad (6).$$

Then, the anti-logarithm values thus obtained are converted into values in exponential notation. The following are obtained by a table of FIG. 7A that is the reverse operation of FIG. 7B:

$$=2, 27, 8, 24, \ldots, 7, 72 \quad (7).$$

Sequence (7) thus obtained is formed in a table, which is used as a sequence permutation table T1 for the first row of the two-dimensional buffer.

Similarly, step S13 is repeated using q2, q3, q4, q5, q6, q7 and q8, so that sequence permutation tables T2–T8 respectively used for permutation of the second through eight rows of the two-dimensional buffer can be obtained.

Step S15:

The intra-permutation of the blocks $B_1$–$B_8$ is performed in accordance with the sequence permutation tables T1–T8.

It is possible to prepare and record the sequence permutation tables T1–T8 beforehand in a memory.

(Third configuration)

A description will be given, with reference to FIG. 9, of the third configuration of the interleaver 22.

Figure 9:
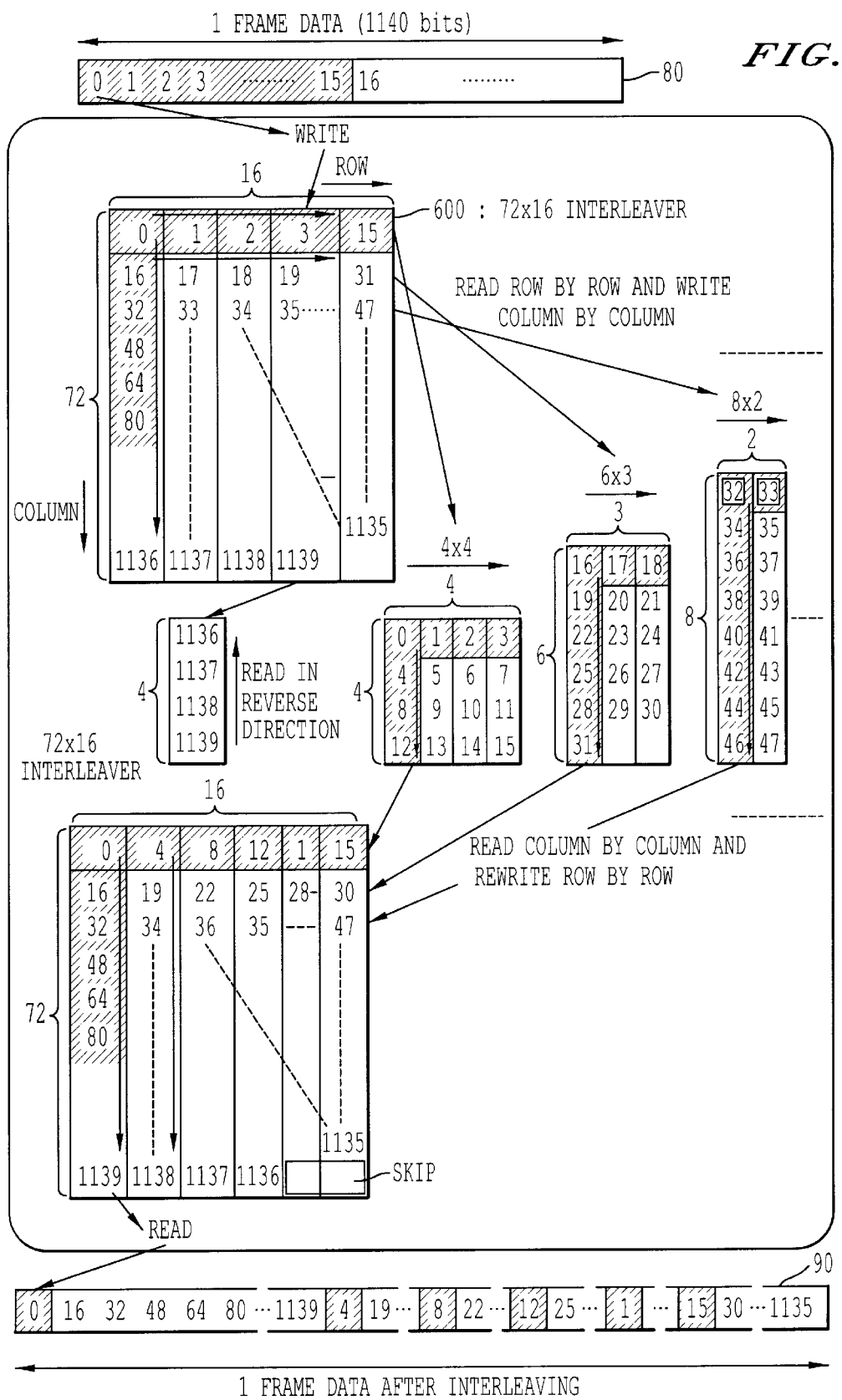
FIG. 9 is a diagram illustrating a third possible configuration of the interleaver shown in FIG. 3.

Referring to FIG. 9, an input sequence 80 consisting of 1140 bits is written into an interleaver 600 having a two-dimensional buffer of a 72×16 array. Then, each row of the 72×16 interleaver 600 is read for every 16 bits. The first row of the interleaver 600 is interleaved by using a 4×4 interleaver 610, and the second row thereof is interleaved by using a 6×3 interleaver 620. Similarly, the third row of the interleaver 600 is interleaved by an 8×2 interleaver 630.

That is, the respective rows are interleaved by the different interleavers. Alternatively, an identical interleaver may be used to interleave each of the rows of the two-dimensional array. It is also possible to use an identical interleaver for some rows of the two-dimensional array.

Then, the data thus interleaved are read in the longitudinal direction (0, 16, 32, 48, . . . ), so that an output data sequence 90 can be obtained.

Since the last row of the buffer consists of only four bits, a 4×1 interleaver is applied thereto. However, the 4×4 or 2×2 interleaver may be used for the last row. The data of the last row can be read therefrom in the order of 1136, 1137, 1138 and 1139. However, in FIG. 9, the data of the last row are read in the reverse order, namely, 1139, 1138, 1137 and 1136.

It is also possible to read data from the 72×16 interleaver except for the last row and to thereafter read the data of the last row and place them at given intervals.

Figure 8:
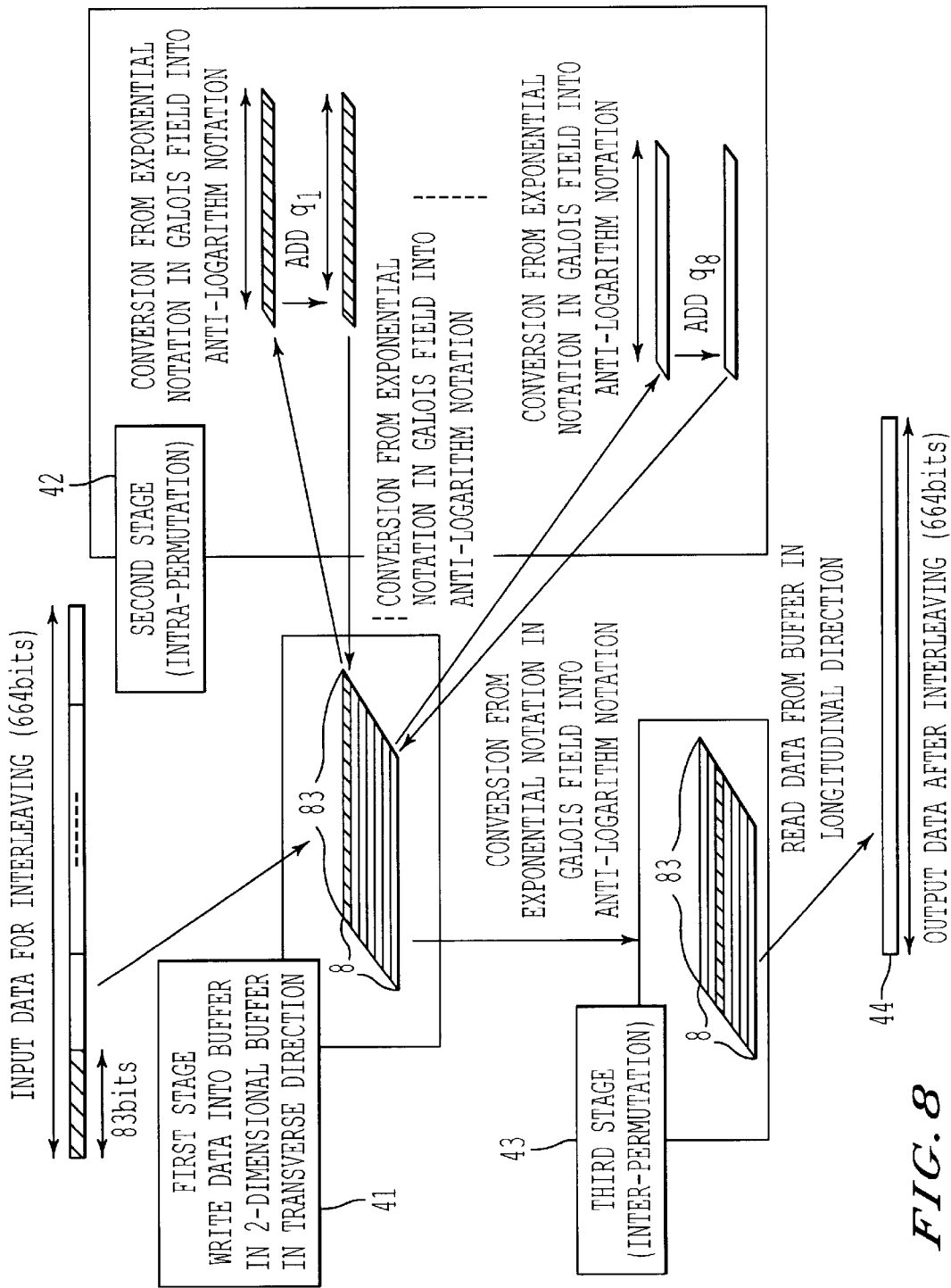
FIG. 8 is a diagram illustrating a second possible configuration of the interleaver shown in FIG. 3.

The interleaver 22 can be formed of any of the first through third configurations. After the interleaved data is produced by the interleaver 22, step 110 of FIG. 10, that is, the third state 43 shown in FIGS. 5 and 8 is carried out.

In the first and second configurations of the interleaver 22, the process at step 110 shown in FIG. 10 can be modified so as to prevent occurrence of a pattern which causes an error floor of the turbo codes.

Figure 11:
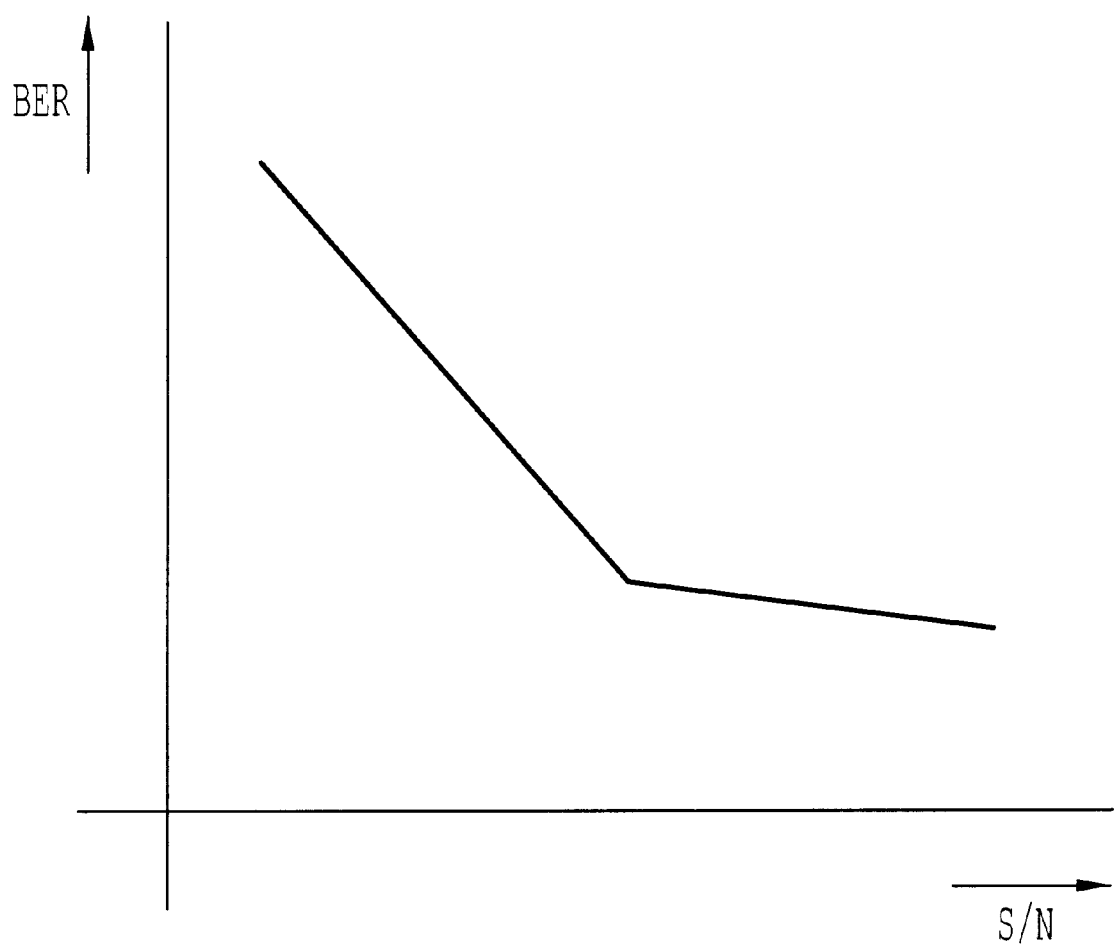
FIG. 11 is a graph for explaining an error floor in turbo codes.

FIG. 11 is a graph showing an error floor. The error floor denotes a phenomenon in which the bit error rate (BER) is not improved as much as the S/N ratio is improved. In the graph of FIG. 11, the error floor starts to occur when the bit error rate is equal to $10^{-7}$ to $10^{-8}$, and is not much improved even when the bit error rate is further improved.

With the above phenomenon in mind, it is preferable to read the data from the two-dimensional array (buffer) in a fixed order but any of a plurality of predetermined orders. That is, it is preferable to determine the order of reading the data from the two-dimensional buffer after the intra-permutation on the basis of the value of the error floor. Thus, it is possible to suppress the occurrence of the error floor in the turbo codes. If the input sequence is divided into 10 blocks $B_1$–$B_{10}$, the data is read from the blocks $B_{10}$, $B_9$, $B_8$, $B_7$, $B_6$, $B_5$, $B_4$, $B_3$, $B_2$ and $B_1$ in this order. If the input sequence is divided into 20 blocks $B_1$–$B_{20}$, the data is read from the blocks $B_{19}$, $B_9$, $B_{14}$, $B_4$, $B_0$, $B_2$, $B_5$, $B_7$, $B_{12}$, $B_{18}$, $B_{16}$, $B_{13}$, $B_{17}$, $B_{15}$, $B_3$, $B_1$, $B_6$, $B_{11}$, $B_8$ and $B_{10}$ in this order. It is also possible to read the data from $B_{19}$, $B_9$, $B_{14}$, $B_4$, $B_0$, $B_2$, $B_5$, $B_7$, $B_{12}$, $B_{18}$, $B_{10}$, $B_8$, $B_{13}$, $B_{17}$, $B_3$, $B_1$, $B_{16}$, $B_6$, $B_{15}$ and $B_{11}$.

One of the predetermined orders of reading the data is selected so that the occurrence of the error floor can be suppressed. As described above, when the input sequence is divided into 10 blocks, data written into the two-dimensional buffer is read therefrom in the reverse direction. This is simple and is implemented easily.

(Puncture process)

Figure 1A:
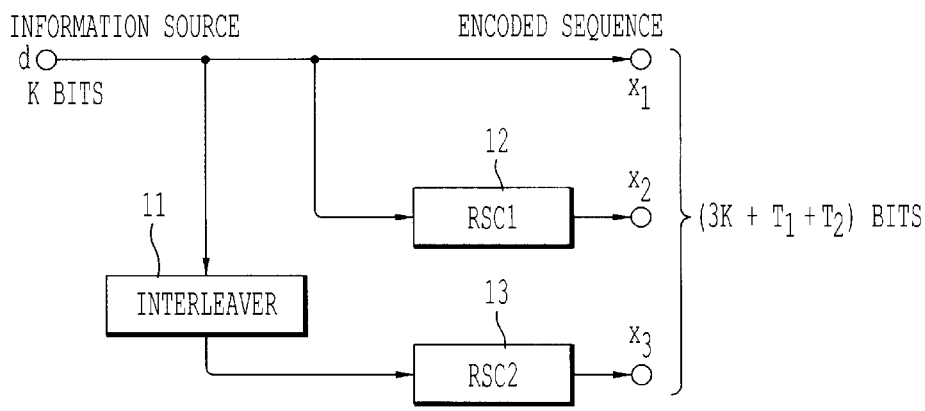
FIGS. 1A and 1B are block diagrams of a conventional turbo encoder.
Figure 1B:
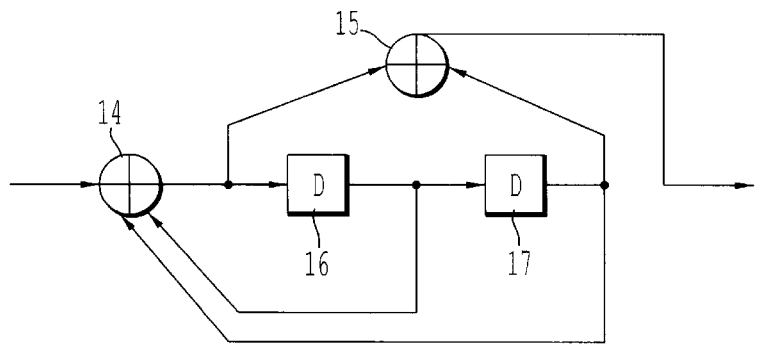
Figure 1C:
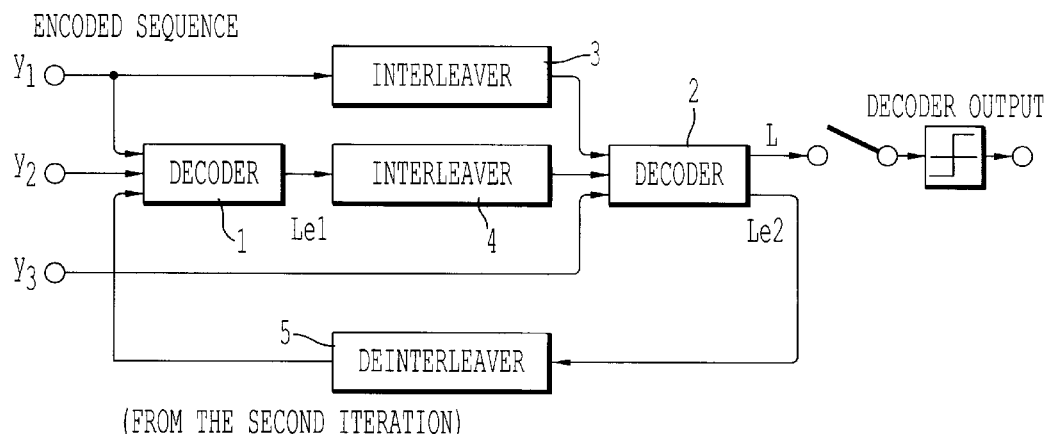
FIG. 1C is a block diagram of a turbo decoder.

The conventional turbo encoder shown in FIG. 1A receives the K-bit input sequence and outputs the (3*K+T1+T2)-bit encoded output where T1 is the number of tail bits output from RSC1, and T2 is the number of tail bits output from RSC2.

In contrast, in the turbo encoder shown in FIG. 3, the bit addition process part 21 adds the a dummy bits to the N bits of the input sequence, so that the (N+a) bits are applied to the interleaver 22, RSC1 and RSC2. That is, 3a bits are auxiliary bits in total. In order to delete the 3a auxiliary bits, the puncturing process part 23 performs a puncturing process for the 3a auxiliary bits. A method of periodically deleting the redundant bits is generally used for the puncturing process suitable for the turbo codes. The above method can be applied to the puncturing process part 23. Thus, the output of the puncturing process part 23 receives (3K+3a+T1+T2) bits and outputs (3K+T1 and T2) to the next stage.

Second Embodiment

Figure 12:
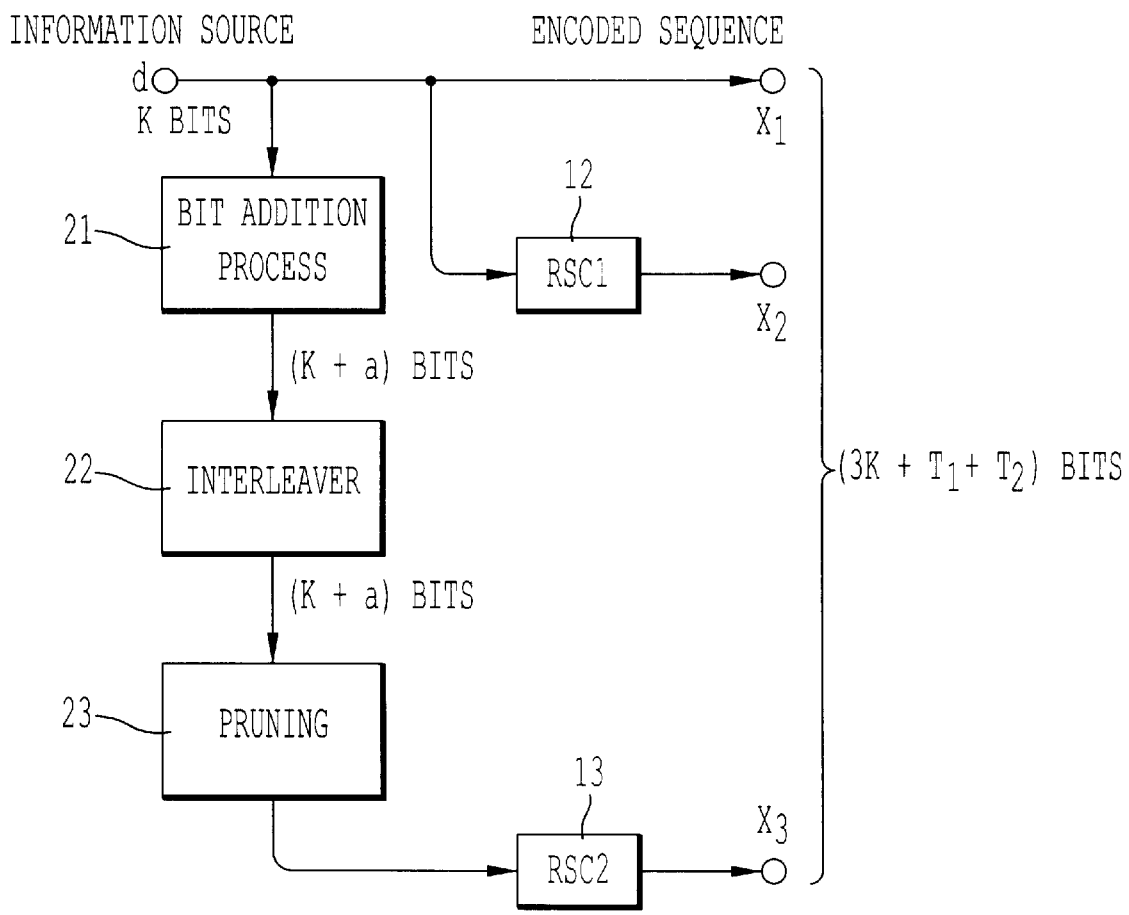
FIG. 12 is a block diagram of a turbo encoder according to a second embodiment of the present invention.
Figure 13:
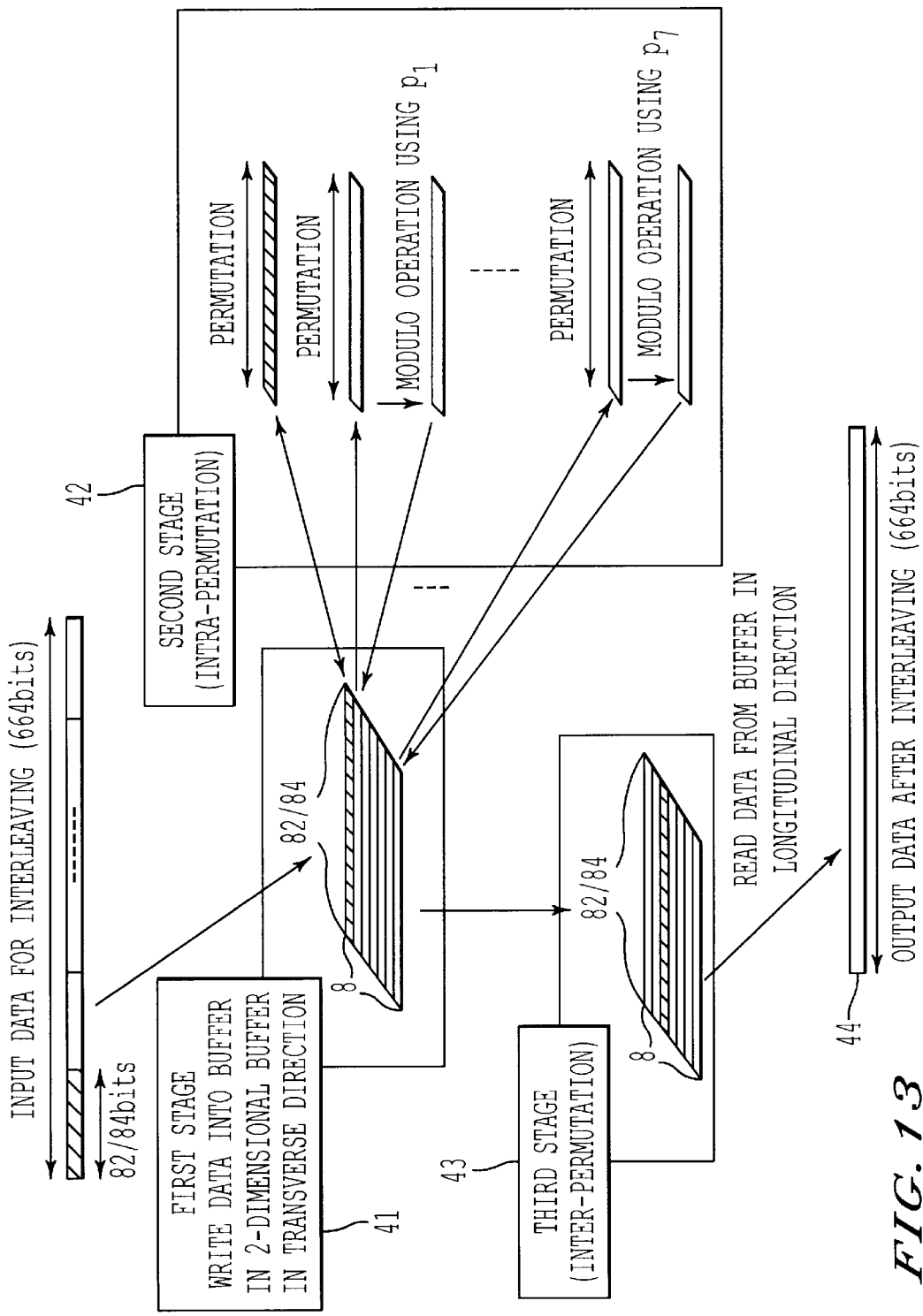
FIG. 13 is a diagram illustrating a fourth possible configuration of the interleaver shown in FIG. 3.

FIG. 12 is a block diagram of a turbo encoder according to a second embodiment of the present invention. In FIG. 12, parts that are the same as those shown in FIG. 3 are given the same reference numbers. The turbo encoder shown in FIG. 12 has the bit addition process part 21 that is placed at the input side of only the interleaver 22. That is, the encoded sequence X1 is the same as the input data sequence from an information source. Further, the RSC1 processes the input data sequence from the information source as per se. In order to delete the dummy bits added to the input data sequence by the bit addition process part 21, a pruning process part 123 is provided between the interleaver 22 and the RSC 2. The interleaver 22 has one of the aforementioned first through third configurations. Now, a fourth configuration of the interleaver 22 will be described.

The fourth configuration of the interleaver 22 can be obtained by slightly modifying the first or second configuration. Such a modification is an improvement in obtaining the prime number, namely, the number of columns of the two-dimensional array. This will be described in detail below.

The bit addition process part 21 operates as follows. At step (1), $N_{IN}$ is divided by 8, and the resultant value n is obtained. At step (2), the prime number P that is greater than n and closest to n is obtained. Further, (P−1) and (P+1) are prepared. Then, one of the numbers P, (P−1) and (P+1) that is equal to or greater than n and is closest to n is chosen. At step (3), the difference between 8 times of P and $N_{IN}$ is calculated, and the resultant value is denoted as a. At step (4), 4 bits (dummy bits) are added to $N_{IN}$ bits of the input sequence.

An example for $N_{IN}$=660 will be described below. At step (1), n=660/8=82.25 (the quotient is 82, and the remainder is 4). At step (2), the prime number P that is greater than 82.25 (=n) and closest thereto is 83 from the table shown in FIG. 4. Further, (P−1)=82, and (P+1)=84. Since the number 83 is greater than 82.25 and is closed thereto, the number 83 is chosen. At step (3), 83*8=664, and thus a=4. That is, the number of dummy bits to be added to $N_{IN}$ is 4. At step (4), 4 dummy bits are added to the input sequence of 660 (=$N_{IN}$) bits. For example, the 4 dummy bits are added to the end of the 660-bit input sequence.

The number ($N_{IN}$+a) of bits thus obtained, that is, the number of (K+a) bits in FIG. 3 is divided by 8 without exception, and the quotient is always any of the prime number P, (P−1) and (P+1).

If the prime number P is chosen at step (2), the sequence permutation tables can be created by the manner that has been described with reference to FIG. 5. However, if (P−1) or (P+1) is chosen, for example, if 82 or 84 is chosen, the two-dimensional array has 82 or 84 columns, and thus the sequence permutation tables associated with P=83 are not used. The sequence permutation tables suitable for 82 or 84 columns can be created by modifying the aforementioned sequence permutation table t0 for 83 columns, as described below.

FIG. 14A shows the sequence permutation table t0 for the first row of the two-dimensional array having 83 columns, which is the same as that shown in FIG. 7B. The sequence permutation table for the first row of the array having 82 columns (let $t0_{-1}$ be that table) is obtained by deleting "0" located at the end of the sequence of the table t0 for 83 columns. That is, the one-dimensional sequence $t0_{-1}$ for 82 columns is as follows:

$t_{0-1}$: 1, 2, 4, 8, 16, ..., 42.

The table $t0_{-1}$ ranges from element 1 to element 82, and 1 is subtracted from each of all the elements. The resultant table ranges from element 0 to element 81, and is used as the sequence permutation table $t0_{-1}$ for the first row for 82 columns.

The sequence permutation table for the first row of the array having 84 columns (let $t0_{+1}$ be that table) is obtained by adding the prime number P to the position next "0" located at the end of the sequence for 83 columns. That is, the one-dimensional sequence $t0_{+1}$ for 84 columns is as follows;

$t0_{+1}$: 1, 2, 4, 8, 16, ..., 42, 0, 83.

By executing steps 106–108 shown in FIG. 10, sequence permutation tables t1–t7, $t1_{-1}$–$t7_{-1}$, and $t1_{+1}$–$t7_{+1}$ for the second through eight rows of the arrays having 83, 82 and 84 columns can be created, respectively. It is possible to create and record the above tables beforehand.

The use of (P−1) and (P+1) makes it possible to decrease the difference between the number of the input data sequence and the number of bits (equal to the number of columns) processed by the interleaver 22 and to reduce the number of bits to be deleted by the pruning process.

The process of the fourth configuration of the interleaver 22 shown in FIG. 12 can be applied to the interleaver 22 shown in FIG. 3.

Another modification can be made. In the first and second embodiments of the present invention, the input data sequence is divided into the fixed number of blocks. This can be modified so that k different numbers of blocks for division can be used where k is an integer equal to or greater than 2. Thus, k interleavers are created, and one of them which brings the best performance is chosen and used.

Let us consider a case where k=10 and 20 and the input data sequence applied to the interleaver 22 consists of 640 bits. For k=10, the 640-bit input data sequence is divided into 10 blocks, and the sequence permutation tables for the 10 blocks are labeled #1. For k=20, the 640-bit input data sequence is divided into 20 32-bit blocks, and the sequence permutation tables for the 20 blocks are labeled #2. Then, one of the sets #1 and #2 of interleavers which provides the better bit error rate and/or the frame error rate is selected. The input data sequences consisting of different numbers of bits should be divided into different numbers of blocks in terms of the bit/frame error rate. That is, the number of blocks is adaptively changed taking into consideration the number of bits forming the input data sequence. Thus, it is possible to improve the performance of the turbo encoder.

The present invention is not limited to the specifically described embodiments, variations and modifications, and other variations and modifications may be made without departing from the scope of the present invention.

What is claimed is:

1. An interleaving method comprising the steps of:
    (a) generating or recording a prime number P by using K bits of an input sequence and N of rows of an interleaver;
    (b) dividing an input sequence into N blocks $B_1, B_2, \ldots, B_N$ each having a length equal to P, where N is an integer equal to at least 2;
    (c) one of generating and recording zeroth sequence permutation data in which elements of a Galois field of a characteristic P are arranged in an order of values of exponent parts of a power notation of the elements;
    (d) one of generating and recording N integers $P_1, P_2, \ldots, P_N$ which are mutually prime with respect to a primitive root used in the power notation;
    (e) one of generating and recording first through Nth sequence permutation data by repeating, ith times (i=1–N), a process for generating ith sequence permutation data which is a sequence of values of exponent parts in power notation of elements obtained by adding $q_i$ to data of the zeroth sequence permutation data;
    (f) permuting data in the blocks $B_1$–$B_N$ in accordance with the first through Nth sequence permutation data; and
    (g) reading permuted data from the blocks $B_1$–$B_N$ in a given order.

2. The interleaving method as claimed in claim 1, wherein the given order of the step (g) is based on a value of an error floor in turbo codes.

3. The interleaving method as claimed in claim 1, wherein:
    there are provided k numbers of N where k is an integer equal to or greater than 2;
    the steps (c) through (e) generate K sets of first through Nth sequence permutation data; and
    the step (f) selected one of the K sets of first through Nth sequence permutation data, a selected set of first through Nth sequence permutation data being related to one of the k numbers of N which provides best performance.

4. An interleaving method comprising the steps of:
    (a) one of generating and recording a prime number P by using K bits of an input sequence and N of rows of an interleaver;
    (b) dividing an input sequence into N blocks $B_1, B_2, \ldots, B_N$ each having a length equal to (P−1), where N is an integer equal to at least 2;
    (c) one of generating and recording first sequence permutation data in which elements of a Galois field of a characteristic P are arranged in an order of values of exponent parts of a power notation of the elements;
    (d) one of generating and recording (N−1) integers $P_1, P_2, \ldots, P_{N-1}$ which are mutually prime with respect to P−1);
    (e) one of generating and recording second through Nth sequence permutation data by repeating, ith times (i=1 (N−1)), a process for generating ith sequence permutation data by cyclically reading data in the first sequence permutation data at intervals of $P_i$,
    (f) permuting data in the blocks $B_1$–$B_N$ in accordance with the first through Nth sequence permutation data; and
    (g) reading permuted data from the blocks $B_1$–$B_N$ in a given order.

5. The interleaving method as claimed in claim 4, wherein the given order of the step (g) is based on a value of an error floor in turbo codes.

6. The interleaving method as claimed in claim 4, wherein:
    there are provided k numbers of N where k is an integer equal to or greater than 2;
    the steps (c) through (e) generate K sets of first through Nth sequence permutation data; and
    the step (f) selects one of the K sets of first through Nth sequence permutation data, a selected set of first through Nth sequence permutation data being related to one of the k numbers of N which provides best performance.

7. An interleaving method comprising the steps of:
(a) one of generating and recording a prime number P by using K bits of an input sequence and N of rows of an interleaver;
(b) dividing an input sequence into N blocks $B_1, B_2, \ldots, B_N$, each having a length equal to (P+1), where N is an integer equal to at least 2;
(c) one of generating and recording first sequence permutation data in which elements of a Galoid field of a characteristic P are arranged in an order of values of exponent parts of a power notation of the elements;
(d) generating or recording (N−1) integers $P_1, P_2, \ldots, P_{N-1}$ which are mutually prime with respect to (P−1);
(e) one of generating and recording second through Nth sequence permutation data by repeating, ith times (i=1−(N−1)), a process for generating ith sequence permutation data by cyclically reading data in the first sequence permutation data at intervals of $P_i$;
(f) permuting data in blocks $B_1$–$B_N$ in accordance with the first through Nth sequence permutation data; and
(g) reading permuted data from the blocks $B_1$–$B_N$ in a given order.

8. The interleaving method as claimed in claim 7, wherein the given order of the step (g) is based on a value of an error floor in turbo codes.

9. The interleaving method as claimed in claim 7, wherein:
there are provided k numbers of N where k is an integer equal to or greater than 2;
the steps (c) through (e) generate K sets of first through Nth sequence permutation data; and
the step (f) selects one of the K sets of first through Nth sequence permutation data, a selected set of first through Nth sequence permutation data being related to one of the k numbers of N which provides best performance.

10. An interleaving apparatus comprising:
first means for one of generating and recording a prime number P by using K bits of an input sequence and N of rows of the interleaving apparatus;
second means for dividing an input sequence into N blocks $B_1, B_2, \ldots, B_N$ each having a length equal to P, where N is an integer equal to or greater than 2;
third means for one of generating and recording first sequence permutation data in which elements of a Galois field of a characteristic P are arranged in an order of values of exponent parts of a power notation of the elements;
fourth means for one of generating and recording (N−1) integers $P_1, P_2, \ldots, P_{N-1}$ which are mutually prime with respect to (P−1);
fifth means for one of generating and recording second through Nth sequence permutation data by repeating, ith times (i=1−(N−1)), a process for generating ith sequence permutation data by cyclically reading data in the first sequence permutation data at intervals of $P_i$;
sixth means for permuting data in the blocks $B_1$–$B_N$ in accordance with the first through Nth sequence permutation data; and
seventh means for reading permuted data from the blocks $B_1$–$B_N$ in a given order.

11. The interleaving apparatus as claimed in claim 10, wherein the given order of the seventh means is based on a value of an error floor in turbo codes.

12. The interleaving apparatus as claimed in claim 10, wherein:
there are provided k numbers of N where k is an integer equal to or greater than 2;
the third through fifth means generate K sets of first through Nth sequence permutation data; and
the sixth means selected one of the K sets of first through Nth sequence permutation data, a selected set of first through Nth sequence permutation data being related to one of the k numbers of N which provides best performance.

13. An interleaving apparatus comprising:
first means for one of generating and recording a prime number P by using K bits of an input sequence and N of rows of the interleaving apparatus;
second means for dividing an input sequence into N blocks $B_1, B_2, \ldots, B_N$ each having a length equal to P, where N is an integer equal to at least 2;
third means for one of generating and recording zeroth sequence permutation data in which elements of a Galois field of a characteristic P are arranged in an order of values of exponent parts of a power notation of the elements;
fourth means for one of generating and recording N integers $P_1, P_2, \ldots, P_N$ which are mutually prime with respect to a primitive root used in the power notation;
fifth means for one of generating and recording first through Nth sequence permutation data by repeating, ith times (i=1−N), a process for generating ith sequence permutation data, which is a sequence of values of exponent parts in power notation of elements obtained by adding $q_i$ to data of the zeroth sequence permutation data;
sixth means for permuting data in the blocks $B_1$–$B_N$ in accordance with the first through Nth sequence permutation data; and
seventh means for reading permuted data from the blocks $B_1$–$B_N$ in a given order.

14. The interleaving apparatus as claimed in claim 13, wherein the given order of the seventh means is based on a value of an error floor in turbo codes.

15. The interleaving apparatus as claimed in claim 13, wherein:
there are provided k numbers of N where k is an integer equal to or greater than 2;
the third through fifth means generate K sets of first through Nth sequence permutation data; and
the sixth means selects one of the K sets of first through Nth sequence permutation data, a selected set of first through Nth sequence permutation data being related to one of the k numbers of N which provides best performance.

16. An interleaving apparatus comprising:
first means for one of generating and recording a prime number P by using K bits of an input sequence and N of rows of the interleaving apparatus;
second means for dividing an input sequence into N blocks $B_1, B_2, \ldots, B_N$ each having a length equal to (P−1) where N is an integer equal to at least 2;
third means for one of generating and recording first sequence permutation data in which elements of a Galois field of a characteristic P are arranged in an order of values of exponent parts of a power notation of the elements;
fourth means for one of generating and recording (N−1) integers $P_1, P_2, \ldots, P_{N-1}$ which are mutually prime with respect to (P−1);
fifth means for one of generating and recording second through Nth sequence permutation data by repeating, ith times (i=1−(N−1)) a process for generating ith sequence permutation data by cyclically reading data in the first permutation data at intervals of $P_i$;

sixth means for permuting data in the blocks $B_1$–$B_N$ in accordance with the first through Nth sequence permutation data; and seventh means for reading permuted data from the blocks $B_1$–$B_N$ in a given order.

17. The interleaving apparatus as claimed in claim 16, wherein the given order of the seventh means is based on a value of an error floor in turbo codes.

18. The interleaving apparatus as claimed in claim 16, wherein:

there are provided k numbers of N where k is an integer equal to or greater than 2;

the third through fifth means generate K sets of first through Nth sequence permutation data; and the sixth means selects one of the K sets of first through Nth sequence permutation data, a selected set of first through Nth sequence permutation data being related to one of the k numbers of N which provides best performance.

19. A turbo encoding method comprising, as an interleaving method employed in a turbo encoder, the interleaving method comprising the steps of:

(a) generating or recording a prime number P;

(b) dividing an input sequence into N blocks $B_1, B_2, \ldots, B_N$ each having a length equal to P where N is an integer equal to or greater than 2;

(c) generating or recording first sequence permutation data in which elements of a Galois field of a characteristic P are arranged in an order of values of exponent parts of a power notation of the elements;

(d) generating or recording (N–1) integers $p_1, p_2, \ldots, p_{N-1}$ which are mutually prime with respect to (P–1);

(e) generating or recording second through Nth sequence permutation data by repeating, ith times (i=1–(N–1)), a process for generating ith sequence permutation data by cyclically reading data in the first sequence permutation data at intervals of $p_i$;

(f) permuting data in the blocks $B_1$–$B_N$ in accordance with the first through Nth sequence permutation data; and (g) reading permuted data from the blocks $B_1$–$B_N$ in a given order.

20. The turbo encoding method as claimed in claim 19, further comprising the steps of:

adding bits to an input sequence applied to the turbo encoder if a number of bits of the input sequence is less than a given number of bits; and deleting bits from an encoded sequence so that an output sequence of the turbo encoder has the same number of bits as the input sequence.

21. The turbo encoding method as claimed in claim 20, wherein the step of adding bits employs a bit repetition method.

22. A turbo encoding method comprising, as an interleaving method employed in a turbo encoder, the interleaving method comprising the steps of:

(a) generating or recording a prime number P;

(b) dividing an input sequence into N blocks $B_1, B_2, \ldots, B_N$ each having a length equal to P where N is an integer equal to or greater than 2;

(c) generating or recording zeroth sequence permutation data in which elements of a Galois field of a characteristic P are arranged in an order of values of exponent parts of a power notation of the elements;

(d) generating or recording N integers $p_1, p_2, \ldots, p_N$ which are mutually prime with respect to a primitive root used in the power notation;

(e) generating or recording first through Nth sequence permutation data by repeating, ith times (i=1–N), a process for generating ith sequence permutation data which is a sequence of values of exponent parts in power notation of elements obtained by adding $q_i$ to data of the zeroth sequence permutation data;

(f) permuting data in the blocks $B_1$–$B_N$ in accordance with the first through Nth sequence permutation data; and (g) reading permuted data from the blocks $B_1$–$B_N$ in a given order.

23. The turbo encoding method as claimed in claim 22, further comprising the steps of:

adding bits to an input sequence applied to the turbo encoder if a number of bits of the input sequence is less than a given number of bits; and deleting buts from an encoded sequence so that an output sequence of the turbo encoder has the same number of bits as the input sequence.

24. The turbo encoding method as claimed in claim 23, wherein the step of adding bits employs a bit repetition method.

25. A turbo encoding method comprising, as an interleaving method employed in a turbo encoder, the interleaving method comprising the steps of:

(a) generating or recording a prime number P;

(b) dividing an input sequence into N blocks $B_1, B_2, \ldots, B_N$ each having a length equal to (P–1) where N is an integer equal to or greater than 2;

(c) generating or recording first sequence permutation data in which elements of a Galois field of a characteristic P are arranged in an order of values of exponent parts of a power notation of the elements;

(d) generating or recording (N–1) integers $p_1, p_2, \ldots, p_{N-1}$ which are mutually prime with respect to (P–1);

(e) generating or recording second through Nth sequence permutation data by repeating, ith times (i=1–(N–1)), a process for generating ith sequence permutation data by cyclically reading data in the first sequence permutation data at intervals of $p_1$;

(f) permuting data in the blocks $B_1$–$B_N$ in accordance with the firsth through Nth sequence permutation data, and (g) reading permuted data from the blocks $B_1$–$B_N$ in a given order.

26. The turbo encoding method as claimed in claim 25, further comprising the steps of:

adding bits to an input sequence applied to the turbo encoder if a number of bits of the input sequence is less than a given number of bits; and deleting bits from an encoded sequence so that an output sequence of the turbo encoder has the same number of bits as the input sequence.

27. The turbo encoding method as claimed in claim 26, wherein the step of adding bits employs a bit repetition method.

28. A turbo encoding method comprising, as an interleaving method employed in a turbo encoder, the interleaving method comprising the steps of:

(a) generating or recording a prime number P;

(b) dividing an input sequence into N blocks $B_1, B_2, \ldots, B_N$ each having a length equal to (P+1) where N is an integer equal to or greater than 2;

(c) generating or recording first sequence permutation data in which elements of a Galois field of a characteristic P are arranged in an order of values of exponent parts of a power notation of the elements;

(d) generating or recording (N–1) inters $p_1, p_2, \ldots, p_{N-1}$ which are mutually prime with respect to (P–1);

(e) generating or recording second through Nth sequence permutation data by repeating, ith times (i=1–(N–1)), a process for generating ith sequence permutation data by cyclically reading data in the first sequence permutation data at intervals of $p_i$;

(f) permuting data in the blocks $B_1$–$B_N$ in accordance with the first through Nth sequence permutation data; and (g) reading permuted data from the blocks $B_1$–$B_N$ in a given order.

29. The turbo encoding method as claimed in claim 28, further comprising the steps of:

adding bits to an input sequence applied to the turbo encoder if a number of bits of the input sequence is less than a given number of bits; and deleting bits from an encoded sequence so that an output sequence of the turbo encoder has the same number of bits as the input sequence.

30. The turbo encoding method as claimed in claim 29, wherein the step of adding bits employs a bit repetition method.

31. A turbo encoder comprising:

a plurality of encoders; and an interleaving apparatus comprising:

first means for generating or recording a prime number P;

second means for dividing an input sequence into N blocks $B_1, B_2, \ldots, B_N$ each having a length equal to P, where N is an integer equal to at least 2;

third means for one of generating and recording first sequence permutation data in which elements of a Galois field of a characteristic P are arranged in an order of values of exponent parts of a power notation of the elements;

fourth means for one of generating and recording (N−1) integers $P_1, P_2, \ldots, P_{N-1}$ which are mutually prime with respect to (P−1);

fifth means for one of generating and recording second through Nth sequence permutation data by repeating, ith times (i=1−(N−1)), a process for generating ith sequence permutation data by cyclically reading data in the first sequence permutation data at intervals of $P_i$;

sixth means for permuting data in the blocks $B_1$–$B_N$ in accordance with the first through Nth sequence permutation data; and seventh means for reading permuted data from the blocks $B_1$–$B_N$ in a given order.

32. The turbo encoder as claimed in claim 31, further comprising:

means for adding bits to an input sequence applied to the turbo encoder if a number of bits of the input sequence is less than a given number of bits; and means for deleting bits from an encoded sequence so that an output sequence of the turbo encoder has the same number of bits as the input sequence.

33. The turbo encoder as claimed in claim 32, wherein the means for adding bits employs a bit repetition method.

34. A turbo encoder comprising:

a plurality of encoders; and an interleaving apparatus comprising:

first means for generating or recording a prime number P;

second means for dividing an input sequence into N blocks $B_1, B_2, \ldots, B_N$ each having a length equal to P, where N is an integer equal to at least 2;

third means for one of generating and recording zeroth sequence permutation data in which elements of a Galois field of a characteristic P are arranged in an order of values of exponent parts of a power notation of the elements;

fourth means for one of generating and recording N integers $P_1, P_2, \ldots, P_N$ which are mutually prime with respect to a primitive root used in the power notation;

fifth means for one of generating and recording first through Nth sequence permutation data by repeating, ith times (i=1−N), a process for generating ith sequence permutation data which is a sequence of values of exponent parts in power notation of elements obtained by adding $q_i$ to data of the zeroth sequence permutation data;

sixth means for permuting data in the blocks $B_1$–$B_N$ in accordance with the first through Nth sequence permutation data; and seventh means for reading permuted data from the blocks $B_1$–$B_N$ in a given order.

35. The turbo encoder as claimed in claim 34, further comprising:

means for adding bits to an input sequence applied to the turbo encoder if a number of bits of the input sequence is less than a given number of bits; and means for deleting bits from an encoded sequence so that an output sequence of the turbo encoder has the same number of bits as the input sequence.

36. The turbo encoder as claimed in claim 35, wherein the means for adding bits employs a bit repetition method.

37. A turbo encoder comprising:

a plurality of encoders; and an interleaving apparatus comprising:

first means for generating or recording a prime number P;

second means for dividing an input sequence into N blocks $B_1, B_2, \ldots, B_N$ each having a length equal to (P−1) where N is an integer equal to or greater than 2;

third means for one of generating and recording first sequence permutation data in which elements of a Galois field of a characteristic P are arranged in order of values of exponent parts of a power notation of the elements;

fourth means for one generating and recording (N−1) integers $P_1, P_2, \ldots, P_{N-1}$ which are mutually prime with respect to (P−1);

fifth means for one of generating and recording second through Nth sequence permutation data by repeating, ith times (i=1−(N−1)), a process for generating ith sequence permutation data by cyclically reading data in the first sequence permutation data at intervals of $P_i$;

sixth means for permuting data in the blocks $B_1$–$B_N$ in accordance with the first through Nth sequence permutation data; and seventh means for reading permuted data from the blocks $B_1$–$B_N$ in a given order.

38. The turbo encoder as claimed in claim 37, further comprising:

means for adding bits to an input sequence applied to the turbo encoder if a number of bits of the input sequence is less than a given number of bits; and means for deleting bits from an encoded sequence so that an output sequence of the turbo encoder has the same number of bits as the input sequence.

39. The turbo encoder as claimed in claim 38, wherein the means for adding bits employs a bit repetition method.

40. An interleaving method, comprising:

one of creating and recording N rows of an interleaver for turbo encoding;

one of generating and recording a prime number P by using K bits of an input sequence and the N rows;

generating a two-dimensional block matrix having a length equal to any of P, P−1, P+1 and the N rows, by using the K input bits, the prime number P, and the N rows;

inputting data having K bits into said two-dimensional matrix; and permuting said data in said two-dimensional matrix.

41. An interleaving method that interleaves K bits of data by using an interleaver having a buffer arranged in a two-dimensional matrix, comprising:

generating a prime number P based on the K bits of data and N rows of the interleaver so that a number of columns of the interleaver is determined by the prime number P;

permuting data in each of the N rows of the interleaver in accordance with a sequence permutation table generated specifically for each of the N rows, based on a primitive root of said prime number P;

permuting an order of the N rows based on a predetermined inter-permutation pattern; and reading out data from the buffer in a column direction of said two-dimensional matrix.

42. An interleaver that interleaves K bits of data by using a buffer arranged in a two-dimensional matrix, comprising:

means for generating a prime number P based on the K bits of data and N rows of the interleaver so that a number of columns of the interleaver is determined by the prime number P;

means for permuting data in each of the N rows of the interleaver in accordance with a sequence permutation table generated specifically for each of the N rows, based on a primitive root of the prime number P;

means for permuting an order of the N rows based on a predetermined inter-permutation pattern; and means for reading out data from the buffer in a column direction of said two-dimensional matrix.

43. A turbo encoding method in which an interleaving method is employed in a turbo encoder to interleave K bits of data by using an interleaver having a buffer arranged in a two-dimensional matrix, the interleaving method comprising the steps of:

generating a prime number P based on the K bits of data and N rows of the interleaver so that a number of columns of the interleaver is determined by the prime number P;

permuting data in each of the N rows of the interleaver in accordance with a sequence permutation table generated specifically for each of the N rows, based on a primitive root of said prime number P;

permuting an order of the N rows based on a predetermined inter-permutation pattern; and reading out data from the buffer in a column direction of said two-dimensional matrix.

44. The turbo encoding method as claimed in claim 43, further comprising:

adding bits to the input sequence if K is less than a given number of bits; and detecting bits from an encoded sequence so that an output sequence of the turbo encoder has a same number of bits as the input sequence.

45. The turbo encoding method of claim 44, wherein the step of adding bits employs a bit repetition method.

46. A turbo encoder, comprising:

a plurality of encoders; and an interleaver configured to interleave K bits of data by using a buffer arranged in a two-dimensional matrix, said interleaving apparatus comprising:

means for generating a prime number P based on the K bits of data and N rows of the interleaver so that a number of columns of the interleaver is determined by the prime number P;

means for permuting data in each of the N rows of the interleaver in accordance with a sequence permutation table generated specifically for each of said N rows, based on a primitive root of the prime number P;

means for permuting an order of said N rows based on a predetermined inter-permutation pattern; and means for reading out data from the buffer in a column direction of said two-dimensional matrix.

47. The turbo encoder as claimed in claim 46, further comprising:

means for adding bits to the input sequence if K is less than a given number of bits; and means for deleting bits from an encoded sequence so that an output sequence of a turbo encoder has a same number of bits as the input sequence.

48. The turbo encoder of claim 47, wherein the means for adding bits employs a bit repetition method.

49. An interleaving method, comprising;

(a) one of generating and recording a prime number P;

(b) dividing an input sequence into N blocks $B_1, B_2, \ldots, B_N$, each having a length equal to P, wherein N is an integer equal to at least one;

(c) one of generating and recording first sequence permutation data, in which elements of a Galois field of a characteristic P are arranged in an order of values of exponent parts of a power notation of the elements;

(d) one of generating and recording (N−1) integers $p_1, p_2, \ldots, p_{n-1}$, which are mutually prime with respect to (P−1);

(e) one of generating and recording second through Nth sequence permutation data by repeating, ith times (i=1−(N−1)), a process for generating ith sequence permutation data by cyclically reading data in the first sequence permutation data at intervals of $p_1$;

(f) permuting data in the blocks $B_1$–$B_N$ in accordance with the first through Nth sequence permutation data; and (g) reading permuted data from the blocks $B_1$–$B_N$ in a given order.

50. The interleaving method of claim 49, wherein the given order is based on a value of an error floor in turbo codes.

51. The interleaving method of claim 49, wherein:

K values of N are provided, where K is an integer equal to at least 2;

steps (c) through (e) generate K sets of first through Nth sequence permutation data; and step (f) selects one of the K sets of first through Nth sequence permutation data, a selected set of first through Nth sequence permutation data being related to one of the K values of N that provides best performance.

* * * * *